United States Patent [19]
Hamer et al.

[11] 3,760,238
[45] Sept. 18, 1973

[54] FABRICATION OF BEAM LEADS

[75] Inventors: Colin A. Hamer; Alberto Loro, both of Ottawa, Ontario, Canada

[73] Assignee: Microsystems International Limited, Montreal, Quebec, Canada

[22] Filed: Feb. 28, 1972

[21] Appl. No.: 229,993

[52] U.S. Cl....... 317/234 R, 317/235 E, 317/234 M, 317/234 N
[51] Int. Cl. .............................................. H01l 5/00
[58] Field of Search ..................................... 317/234

[56] References Cited

UNITED STATES PATENTS

| | | | |
|---|---|---|---|
| 3,513,022 | 5/1970 | Casterline et al. | 117/212 |
| 3,518,506 | 6/1970 | Gates | 317/234 |
| 3,597,658 | 8/1971 | Rivera | 317/234 |
| 3,550,261 | 12/1970 | Schroeder | 29/583 |
| 3,654,526 | 4/1972 | Cunningham | 317/234 |

*Primary Examiner*—John W. Huckert
*Assistant Examiner*—E. Wojciechowicz
*Attorney*—Edward E. Pascal

[57] ABSTRACT

A structure and method of fabricating beam leads or bump terminals for semiconductor chips in which a common potential for plating purposes is obtained using a metallized short circuitry grid in the cleavage channel which is severed during chip separation. The grid is deposited at the same time as normal metallization, and the beams or bumps are plated through holes in a scratch protection layer used as a mask.

13 Claims, 12 Drawing Figures

FABRICATION OF BEAM LEADS

This invention relates to improvements to semiconductor devices, and particularly to the fabrication of beam leads on said devices.

Semiconductor manufacturers have continuously attempted to decrease the cost of connection of semiconductor devices to external circuits, since connection using common wire bonds requires considerable manual labour and generally results in decreasing yields with increasing numbers of bonds. In recent years, effort has been directed toward the fabrication of beam leaded semiconductor chips, i.e., semiconductor chips having cantilevered beams extending past their edges, to which external connections are to be made. Beam leaded chips lend themselves well to semi-automated external connection, in which machines such as wobble-bonders, etc., may be used.

Perhaps the classic structure and fabrication technique of beam leads for semiconductor chips is described by M.P. Lepselter in the Bell Laboratories' Record of October/November 1966, page 299 and following. This article describes a complex structure having layers of silicon dioxide, silicon nitride, silicon dioxide (later removed), titanium, platinum, and gold successively built up over the surface of the chips, which forms a reliable contact of platinum silicide at the semiconductor surface. The layer of titanium which bonds well with the platinum silicide and silicon nitride is used as an intermetal, with the layer of platinum as a further intermetal between the gold and titanium which bars reaction of the latter two metals with each other. An electroformed gold beam lead provides a massive cantilevered terminal for external connection.

While the Lepselter technique and structure provides an extremely good beam lead, the surface of the semiconductor being sealed, it must be realized that the process is very costly due to the large multiplicity of process steps, including at least two stages of sputtering (first platinum for platinum silicide and then titanium and platinum), and many masking and etching steps. The titanium and platinum also provides an equipotential plane, required for even electrodeposition of gold.

There have been numerous attempts to overcome the complexity of the Lepselter process. Most of these, including the present invention, utilize low cost metallization to provide both contact to the silicon and circuit interconnecting conductors, to which massive cantilevered metal beams are then added, physically attached to each chip around its periphery and electrically continuous with the interconnecting conductors at points of external electrical terminations.

The preferred contact and interconnecting conductor metallurgy is usually aluminum, which is widely used in the silicon microcircuit industry, and the preferred external terminal metallurgy is usually gold because of its good electrical, mechanical, and chemical properties, easy deposition by electroplating, and its ready bondability to gold and other metals by the well known thermocompression bonding process.

In general, processes used to form beam leads can also be used to form thick metal terminals entirely within the chip area which may be used as bonding "bumps" in the chip mounting technique commonly known in the semiconductor industry as flip chips. The process of this invention is specifically of value in fabricating either beam leaded or bump terminated devices.

For the purpose of this disclosure, either beam leads or bumps will be covered by the term "external terminal."

In order to achieve a satisfactory structure, it is necessary to achieve (*a*) satisfactory adhesion of the terminals to the silicon chip, (*b*) satisfactory low resistance electrical connection between terminals and interconnect conductors, (*c*) uniform quality and thickness of metal deposition on the terminals, (*d*) an external terminal fabricating process which does not damage, degrade, or reduce the reliability of the contacts, interconnection metal and underlying devices, and (*e*) a stable interface between the two metallurgical systems through a wide temperature range. In the case of the preferred metallurgical system, this means that aluminum and gold must be separated by an intermediate conductor which is metallurgically stable with both.

In order to achieve economic viability, the above objectives must be achieved at the lowest possible cost. This implies a simple, reliable process with minimum labour content and/or utilizing minimum cost equipment and yielding a high proportion of useable product.

Prior art processes, while varying in many details, have generally incorporated the following common steps assuming aluminum-gold metallurgy: (*a*) an insulating layer is deposited over an aluminum metallization pattern, (*b*) holes are formed through this layer by photolithography, to expose external terminal areas; (*c*) one or more metal layers are deposited over the entire wafer surface in a high vacuum deposition (evaporation or sputtering) process, (*d*) a photoresist mask is applied over the metal layers to define the areas of the external terminals to be electroplated, (*e*) the external gold terminals are built up to the desired thickness by electrodeposition, (*f*) the photoresist masking material is removed, and (*g*) the vapour plated metal layer(s) are removed from the unplated surface by etching.

It will be noted that these processes generally include two photolithographic steps, one to cut holes in the insulating layer, and one to limit the area of electrodeposition. The vacuum deposited metal serves several purposes: to obtain adhesion of the gold to the aluminum, to provide a barrier layer between the aluminum and gold, and to provide a conducting layer on which to plate all external terminals at the same electrical potential.

The conducting layer is very important to obtain uniform thickness and quality of gold on the external terminal areas, since without it, each terminal would be connected to the others only through the various pn junctions and diffused areas of the devices of the silicon circuits on the chip, and very non-uniform electrodeposition would result.

In some versions of this process the holes in the insulating layer are laterally displaced from the aluminum and expose an intermediate barrier conductor, connected to the aluminum, on which the gold for the external terminals is deposited. This sometimes makes an even more complex process, since an additional vacuum deposition and photolithographic step may be required to deposit and form the intermediate barrier conductor, while the previously mentioned vacuum deposited layer is still required to provide a continuous conductor for plating control. Hence, it is apparent that prior art processes are still very complex, since they incorporate several photolithographic steps and vacuum depositions involving costly and complex equipment.

In addition to this complexity and cost, prior art processes suffered from another problem which frequently resulted in poor yields and in an unreliable product. The nature of the vacuum deposited metals used to obtain adhesion is such that their removal during the last process stages requires the use of chemical etchants, which are also specifically corrosive to aluminum. Successful execution of the process, therefore, depends critically on the complete protection of the aluminum from attack by these etchants. The deposited insulating layer must provide this protective function. it is well known that the preparation of thin deposited layers of any type, which are entirely free from pinholes, even onto perfectly flat and very carefully prepared surfaces, is an extremely difficult process to carry out consistently. In the case of silicon microcircuits, the surface always contains a very high density of minute irregularities or steps, due both to the photolithographic, oxidation, and diffusion processes used to fabricate the circuit components, and to the multiplicity of narrow metal stripes which comprise the circuit interconnection pattern. These surface irregularities make it much more difficult to obtain depositions which exhibit a very low pinhole density. Consequently, it is very common experience that the aluminum is locally corroded during the etch removal of the unwanted portion of the vacuum deposited layer, due to penetration by the etchant through pinholes in the insulating layer. Since in a modern microcircuit, there are typically several hundred interconnecting conductors on each circuit, each of which may have a cross section of as little as 8 × 1 microns, it is evident that there is a very high risk that at least one such conductor may be etched through or seriously weakened. The failure of any one conductor will generally destroy the complete circuit. Furthermore, there is a severe reliability hazard due to the possiblity of entrapment of the etchant, which may cause a slow corrosive attack on the conductors after the circuit has successfully passed final tests and is placed in service.

Attempts to solve this problem by leaving the photoresist which is used to cut holes in the insulating layer in situ, to provide additional etch protection, have generally failed, since it has been found that its presence in the vacuum plating system degrades adhesion of the deposit and also leads to contamination of the vacuum system.

A further disadvantage to the prior art processes is that vacuum deposition, using sputtering or electron beam methods, may cause radiation damage to some types of silicon devices, especially those that are highly surface sensitive such as metal oxide semiconductor (MOS) devices and low power bipolar linear circuits, thereby causing unacceptable changes in their electrical parameters.

For the same reasons and also for reasons of the nonplanarity of the surface, sputter etching of the vacuum deposited layer does not present a satisfactory solution to the etch corrosion problem.

The present invention achieves a beam lead or external terminal structure, using the above-described aluminum-gold metallurgy by means of a process sequence which is substantially simpler, reproducible, results in a high yield of resulting product, and is free from the difficulties described above which are associated with prior art methods.

The inventive process has also been found to be fully compatible with well established silicon microcircuit manufacturing methods. Hence it can utilize and exploit substantial portions of standard processes and process sequences, so that gold beam leads or bump external terminals can be incorporated on aluminum metallized silicon microcircuits with a minimum of additional process steps and with a minimum of additional equipment, and thus at minimum additional cost.

It has also been found that gold beams or bumps incorporated with all known types of aluminum metallized silicon microcircuits according to the invention does not appear to cause deleterious changes in the electrical parameters or inherent reliability of said microcircuits.

The inventive process thus results in comparatively massive metallic external terminals, either in the form of beam leads or of thick metallic bumps, either of which may be used subsequently to bond the chips to a suitable carrier or substrate and establish all the necessary electrical connections thereto, by thermocompression bonding, soldering, welding, or a like joining process.

It will therefore be appreciated that the starting material of this process comprises silicon slices which have been extensively prefabricated by any of a number of microcircuit fabrication processes essentially consisting of a sequence of thermal oxidations, photolithographic etches and diffusions — epitaxial silicon deposition, etc., in order to create therein a desired pattern of active and passive devices comprising resistors, diodes, transistors, field effect transistors, or the like. Subsequent to the formation of these devices, a thin layer of aluminum is adherently deposited over the entire front surface of the slice, such that it makes direct contact to the silicon at predetermined contact areas, but is insulated from the silicon in all other areas by a layer of insulating material. The insulating material preferably is comprised of thermally grown silicon dioxide, with or without additionally deposited insulating material such as silicon nitride, silicon monoxide, aluminum oxide, various glasses, etc., through which holes had been etched to expose the said selected contact areas. The aluminum layer is then formed into a desired circuit pattern of interconnections by photolithographically etching away unwanted parts of it, so that the various active and passive devices are joined up into useful electronic microcircuits. Accordingly, there is created a wide range of silicon microcircuits of either the bipolar or metal-oxide-semiconductor (MOS) structure suitable for linear, digital, or memory type electronic functions, all of which constitute suitable base materials for this invention.

Briefly, in a method of fabricating a beam lead semiconductor device, the invention is based on the steps of defining a multiplicity of chip areas on a semiconductor slice as described above, each surrounded by an inactive region, forming an adherent insulative layer over the surface of the slice, except over predetermined contact areas, forming a metallized pattern on each chip area over the insulative area and contact areas extending into the inactive region, including external terminal areas, and also in a grid pattern connecting all the beam areas over the inactive region; forming an insulative layer over the entire surface of the slice with the exception of the external terminal areas, coating only the external terminal areas with an intermetal compatible with the metallized material and terminal material; electroforming conductive terminal material over the intermetal; whereby the grid pattern forms an electrical interconnection conductor between each of the external terminal areas; and separating each of the chips along the inactive region, open circuiting the grid pattern between the external terminals.

Accordingly, it is clear that the starting material may be processed identically and together with similar products destined for wire bonded assembly. The total number of photolithographic masks required, and their utilization in the process, is identical with normal aluminum metallized product having a top scratch protection coating. However, the mask designs for this invention must be appropriate to the centre to centre spacing and metallization geometry required.

The mask used to cut the aluminum metallization layer, must contain special features essential to the external terminal metallization process. Specifically, the aluminum metallization circuit pattern must include a pattern of interconnect conductors, the external terminal areas to be further plated and a continuous set of conductors linking together all such terminal areas in such a manner that said conductors will be severed or removed during the final chip separation process. In one embodiment in which beam leads are fabricated, this is achieved by a rectangular grid of conductive stripes which lie wholly within the silicon area subsequently removed during separation of chips by etching. In the case of "bump" terminals, a conductor connects together all terminal areas by running from one terminal to an adjacent one on the adjoining chip over the silicon area between the chips, thence back to the next such area on the first chip, and so on to all terminal areas. This conductor will likewise be severed between all terminals during chip separation, whichever separation technique is employed. The purpose of the short circuiting conductor is to provide a potential clamping function during terminal plating processes for which a continuous vacuum plated layer was provided in prior art processes. The necessity of the vacuum plated layer on this account has thus been eliminated by using the available interconnect metallization layer for the same purpose.

An insulating layer is then deposited over the entire slice surface, including the aluminum metallization. The layer is advantageously silicon dioxide. Holes are then etched in the insulating layer to expose the aluminum at the external terminal areas.

The next step in the process is to immerse the slice in a solution containing alkaline zincate. This solution penetrates the thin natural aluminum oxide skin on the surface of the exposed aluminum and deposits a thin layer of metallic zinc thereon, by electrochemical displacement of some aluminum, thereby producing a surface to which other metals may be readily plated with good electrical contact and adhesion. Without this treatment, adherent layers of other electroplated or chemically plated metals cannot generally be obtained on aluminum, due to the natural oxide skin thereon. It will be noted a second function of the vacuum deposited layer of prior art processes, the achievement of good adhesion to aluminum, has thus been achieved.

The next step is to plate metallic nickel onto the zinc treated aluminum terminal areas. This is most advantageously carried out by immersion in a suitable electroless nickel bath, which will not normally deposit nickel on the insulator surface, but it may also be carried out by electrodeposition of nickel. The nickel so deposited serves as an effective barrier layer between the aluminum and subsequently plated gold, thereby preventing the formation of undesirable intermetallic compounds between them. Nickel is a satisfactory metal for this function as it is metallurgically stable with aluminum, zinc, and gold, in the temperature range of interest, and the rate of diffusion of aluminum and gold through nickel is low. Hence, the provision of an intermetal, obtained in prior art processes by vacuum deposition, has been achieved by simpler and cheaper means.

As the final step in metallization of the external terminal areas, gold is electrodeposited to the desired thickness. The continuous conductor grid pattern insures uniform plating potential at all external terminal areas. It should be noted that the conductor grid pattern is important in obtaining uniform plating in the zincate, nickel and gold deposition processes, all of which are electrochemical in nature and therefore sensitive to surface potentials.

It should be further noted that no corrosive etchants have been used and the wet chemical treatments all deposit metal onto exposed aluminum, whether exposure is due to an intentionally etched terminal area or an accidental defect in the deposited insulating layer. Hence there is no risk of rendering the interconnect pattern open circuit by etchant attack through pinholes.

As a final step, the photoresist mask, if left on, may be removed and the chips separated by one of a number of separation processes, such as scribe and break, sawing, etching from the back surface, or a combination of these. Due to the layout of the conductor grid pattern, the short circuit is removed between every terminal area by the severing of the conductors or removing the whole grid within the space between the chip areas during chip separation, without exposing the front face of the slice to etchants which could harm the interconnect pattern by penetration through defects in the insulating layer.

While the process has been described with particular reference to an aluminum circuit pattern, silicon dioxide plating mask, and zinc/nickel/gold plated terminals, it should be noted that the method is applicable to a number of metallurgical and insulator systems with similar facility and advantages. For example, the insulating function served by the deposited silicon dioxide layer may be achieved by using a photoresist mask only, if the final protection of oxide coated interconnects is not desired.

A more detailed description of the invention will be found below, with reference to the following drawings, the figures being distorted for the purposes of clarity, in which.

The preferred embodiment, in which beam leaded chips are fabricated, will now be described by way of example.

Figures 1, 3:
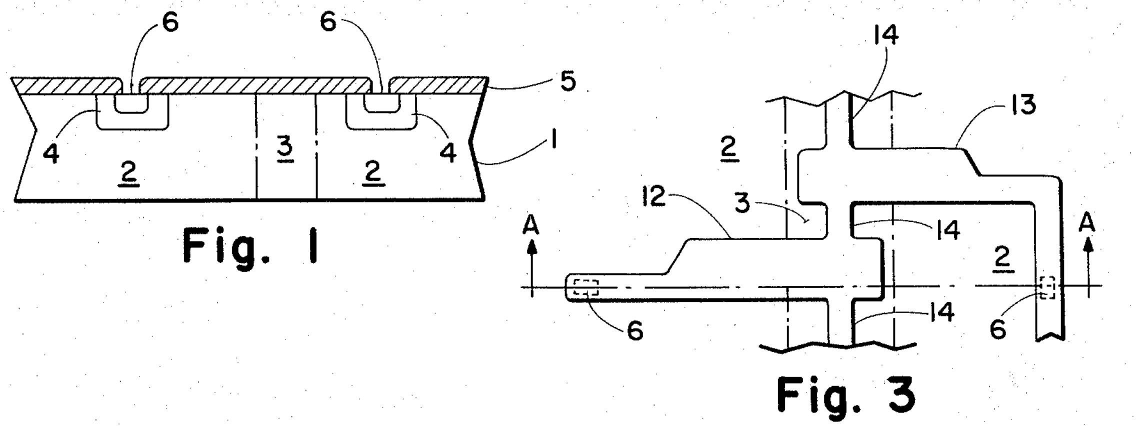
FIG. 1 is a cross-section of a portion of a semiconductor slice.
FIG. 3 is a plan view of a portion of a metallization pattern as in FIG. 2.

Turning now to FIG. 1, a cross-section of a portion of a semiconductor slice 1 is shown, containing active regions 2, and inactive region 3, the regions demarcated by the broken lines. The term "inactive region" is used here for the sake of convenience, and refers to a region between the active chip areas which is waste with respect to the active semiconductor chips, and may be substantially etched away, or within which cleavage may occur. Additional portions of the wafer on each side of the inactive region may be considered as "inactive," in that active devices do not intrude. However, for the purposes of this specification, inactive regions will mean the separation channels between chip regions.

Within the slice 1 there usually will be numerous diffused regions 4 described earlier, according to well known structures. For ease of description a single pair 2,2 thereof will be considered, on each side of an inactive region 3, beam lead types of external terminals to be attached and electrically connected to each. The beams need not lead directly to the diffused regions as shown; they may be more conveniently placed and connected according to a desired circuit layout.

Covering and adherent to the top surface of the slice 1 is a non-conducting-coating 5. It is preferred that the coating be silicon dioxide, which can be formed in a well known manner, for instance by heating a silicon semiconductor slice at a temperature of between 800° and 1250°C in the presence of water vapour.

Contact holes 6 are etched in the silicon dioxide layer above the diffused regions 4 in a well known manner. The holes are preferably defined by photolithographic means, and the silicon dioxide layer etched through exposed gaps in photoresist material.

A layer of aluminum metallization is then adherently deposited on the surface of the slice over the nonconducting coating 5, and in contact with the surface of the silicon slice 1 through the aforementioned holes 6. The aluminum metallization layer 7 may be deposited by well known means, such as by vapour deposition, and then the circuit path defined by etching through a layer of photoresist. Typically the thickness of the aluminum is about 1 micron, but may usefully be between 0.5 and 2 microns.

Figure 2:
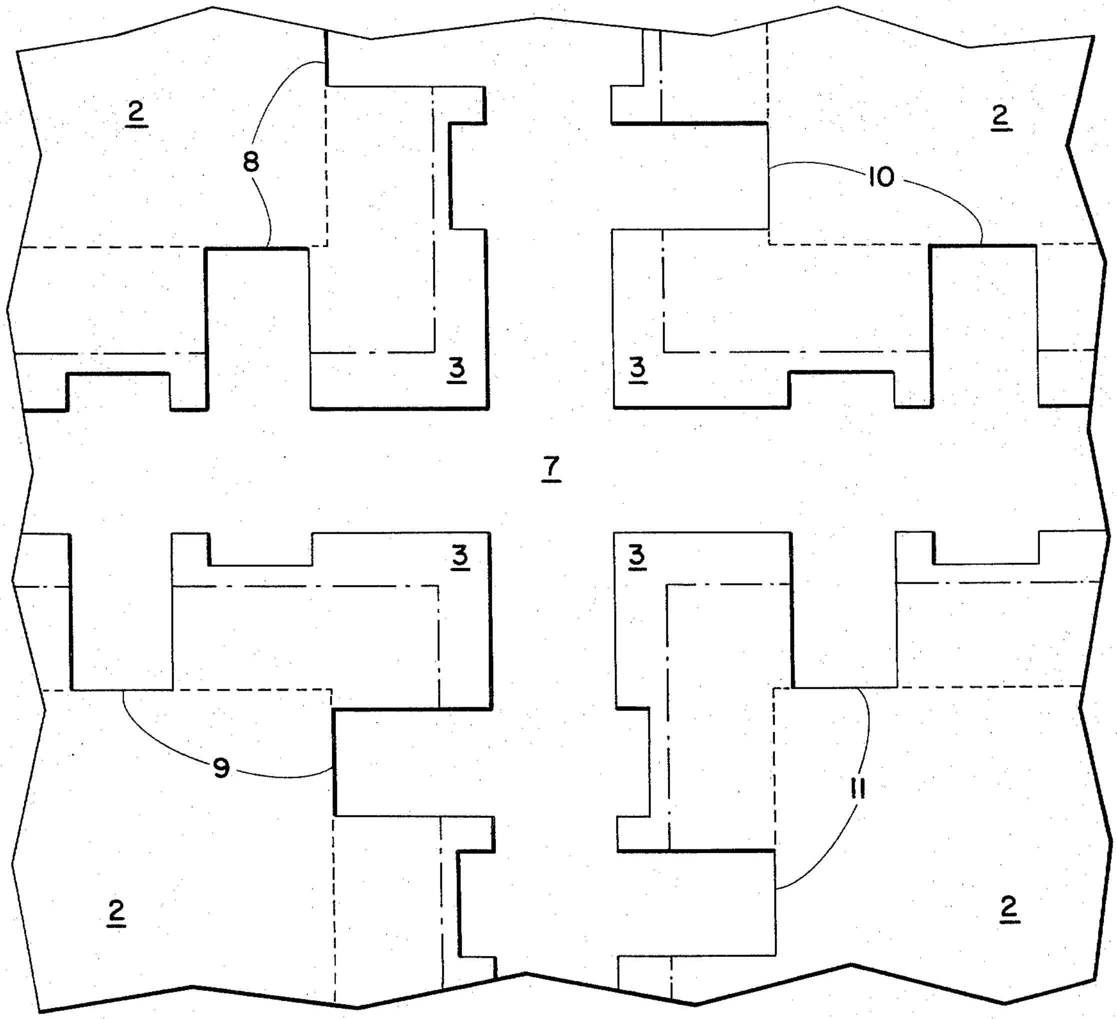
FIG. 2 is a plan view of a portion of a metallization pattern on the surface of the semiconductor slice at the mutual corner of four chip regions.

In accordance with the invention, at the same time that the circuit pattern is defined, so are the external terminal areas. FIG. 2 shows in plan view the metallization at the intersection of four dies on the slice, in which reference numerals 8, 9, 10, and 11 represent external terminal beam areas extending from each of the four chips 2 respectively. The metallization pattern over the active region of each of the chips has been deleted for the sake of clarity. Inactive region 3, demarcated by the inner broken lines extends under each of the beam and grid areas. The beam areas should extend from the active area of an associated chip over the inactive region 3, just short of the opposite side of the inactive region.

As noted above, a grid pattern 7 of aluminum metallization, deposited and defined at the same time as the beam areas interconnects all beam areas over the inactive region. It is preferred that the grid pattern have width substantially narrower than the inactive region 3; its sole function is to interconnect each of the metallized beam patterns for later metallic deposition.

A pair of aluminum metallized beam areas 12 and 13 is shown in plan view in FIG. 3, interconnected by a portion of the grid pattern 14. This figure further shows metallization strips extending over holes 6, making contact directly with the surface of the silicon 1.

Figure 4:
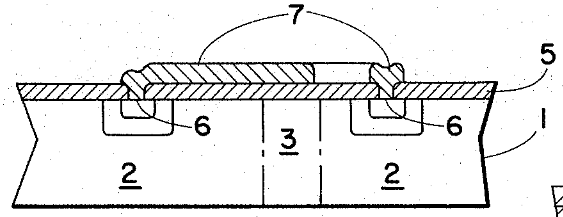
FIGS. 4 through 6 are cross-section views of a semiconductor slice taken through Section A—A of FIG. 3 during successive stages of processing.

FIG. 4 shows Section A—A of FIG. 3, with the metallization layer 7 extending almost completely over the inactive region 3.

A scratch protection layer of non-conducting material such as silicon dioxide is now adherently deposited over the entire surface of the device, with the exception of the beam areas. This may be done in two steps: first depositing a layer of silicon dioxide over the entire surface, for instance by the decompassing of silane and oxygen at about 400°C. The silicon dioxide directly over the beam areas is then etched through a photoresist mask using hydrofluoric acid buffered with ammonium fluoride.

Figure 5:
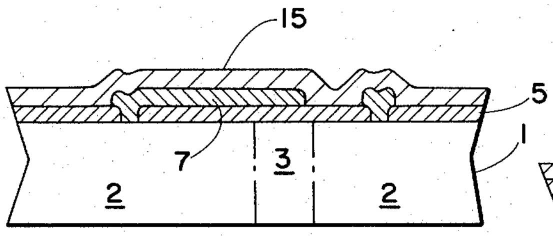
Figure 6:
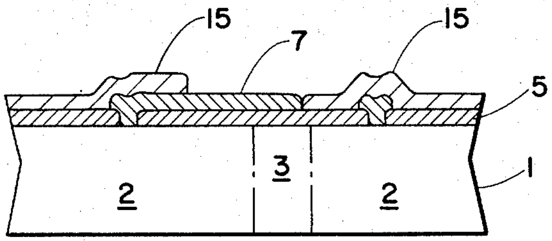
Figure 7:
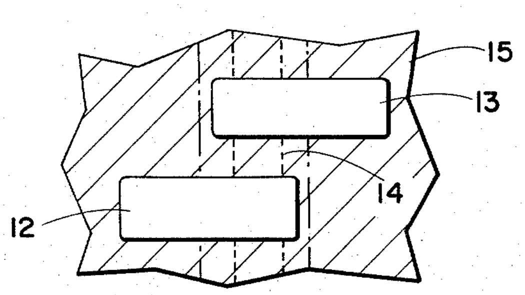
FIG. 7 is a plan view of a portion of a semiconductor slice showing the exposed metallized areas in preparation for an electrodeposition of the beams.

Sectional view FIG. 5 shows the top layer of silicon dioxide 15 covering the entire surface, while FIG. 6 shows the slice in section after the top layer has been etched to expose the metallization layer 7 over the beam areas. Plan view FIG. 7 shows a portion of the top surface with the beam areas 12 and 13 exposed, the remainder of the surface, including the grid pattern 14, covered with the top layer of the silicon dioxide 15.

The silicon dioxide 15 now functions both as a well known scratch protection layer for the surface of the entire slice, and specifically according to this invention, as a mask for further metal deposition.

The scratch protection top layer of silicon dioxide may be doped with phosphorous for additional protection against alkaline ion contamination.

Gold cannot be electrodeposited directly on aluminum due to an aluminum oxide skin which is normally present on its surface. According to this invention, a suitable intermetal is used for adherence and electrical conduction between the exposed aluminum in the beam areas, and the massive materials used for the beams, as well as a barrier between the aluminum and later-to-be deposited gold.

It is emphasized at this point that should the fabrication of the semiconductor devices be carried out in two stages, the first being the stage of diffusion of active devices, deposit and definition of the metallized circuit, and deposit of scratch protection oxide; and the second stage being the one of fabrication of the beam leads, only two standard masks in the first stage need be slightly changed to accommodate the relatively simple second stage. The first is the metallization mask, in which external terminal areas will be defined including the interconnecting conductive grid. The second mask is the one which defines the external terminal areas through the scratch protection top layer of silicon dioxide, in which the location bumps or beam areas will be exposed, rather than the locations of the usual bonding pads.

Any photoresist covering the top scratch protection silicon dioxide, used to define the exposed beam areas, may be left as additional protection to the device during subsequent processing.

Figure 8:
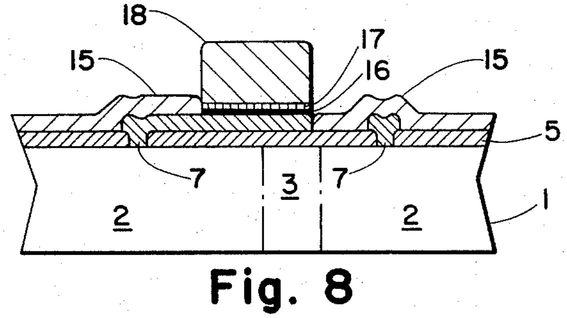

Once the beam areas are exposed, the second stage begins by dipping the entire slice into an alkaline zincate solution which dissolves the oxide on the aluminum and immersion-deposits a thin layer of zinc on the exposed aluminum in the beam areas. It will be found that the resulting zinc adherent skin is about 1,000 angstroms in thickness, but this may vary since the reaction is self limiting. The zinc coating is shown in FIG. 8 as the heavy line 16.

The zinc is then covered with an adherent nickel coat, using an electroless process in the preferred embodiment. A suitable plating solution is sold by Oxy Metal Finishing of Canada, Rexdale, Ontario, under the trademark SEL-REX, and is described in brochure MC-01 114 B, entitled "Operating Instruction SEL-REX Electroless Nickel Process." The nickel is usefully built up to a thickness of approximately between 0.5 and 2 microns, but typically is about 1 micron.

The zinc and nickel layers deposit only over the exposed aluminum, and not over the scratch protection oxide 15, nor over the covered grid pattern.

It should be understood that no claim is being made for the specific metallurgy of electroless plating of zinc and nickel on aluminum. This specific metallurgy is described in U.S. Pat. No. 3,597,658 to John Rivera, issued Aug. 3, 1971 to which the reader is referred.

The slice is then electroplated to deposit the relatively massive beams. Gold preferably is deposited to a thickness of about 10 to 15 microns. A suitable gold plating solution is SEL-REX trademark Pur-A-Gold 125.

It will be found that the zinc, nickel and gold are all deposited evenly over the metallic exposed surface, due to the aluminum grid interconnecting the beam area causing all to be of equipotential.

FIG. 8 shows the slice in section as processed up to this stage. Zinc coating 16 adherent to the exposed beam areas of the aluminum metallization layer 7 is adherently coated with nickel layer 17, which is further adherently coated with relatively massive gold beams 18.

As alternative examples, electroless silver may also be plated instead of nickel, and the beams built up of electroplated silver or copper, rather than gold, if desired.

If previously left on, the photoresist layer, used to etch holes in the protective silicon dioxide, is now removed.

While the individual chips have not yet been separated from the slice, the slice as it stands at this stage is a saleable product. The customer sometimes prefers to perform the final chip separation and testing stages as a measure to save costs.

Figure 9:
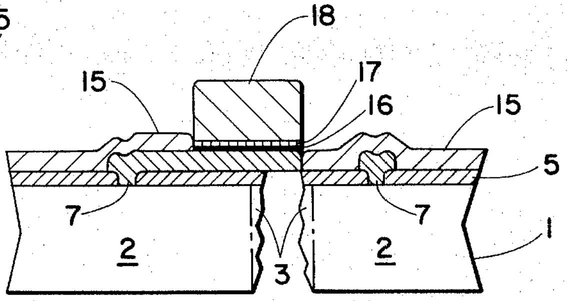
FIGS. 8 through 10 are cross-sectional views of a portion of the slice during successive stages of processing, FIG. 10 showing adjacent edges of a pair of chips at the stage of separation.

The chips on the silicon slice 1 are then separated, such as by back etching in a well known manner through a photoresist mask, in order to remove the inactive region, as shown in section in FIG. 9. An etchant mixture of hydrofluoric, acetic and nitric acids will be found to etch through the silicon of the slice 1 as well as the silicon dioxide 5 above the inactive region as shown in FIG. 9.

Figure 10:
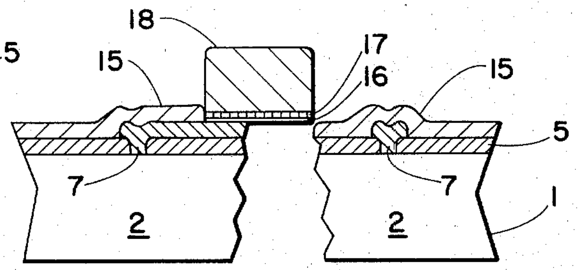

Using the etched trough in the inactive region as a mask, the exposed aluminum in the trough is etched in a well known manner using phosphoric acid. The top oxide layer over the inactive region, previously masked by the aluminum grid is then etched in buffered hydrofluoric acid. The result is shown in FIG. 10. Throughout this etching operation the slice is waxed face down to a suitable innert support so that the front face of the devices are never exposed to the etchants.

It should be noted that the exposed aluminum etched away in the final separation step consists of the aluminum grid, as well as exposed beam aluminum. The short circuiting grid between the beams is thus eliminated. The amount of aluminum of the beam in the inactive region which is removed is of no consequence, since virtually the entire beam structure now resides in the gold.

Figure 11:
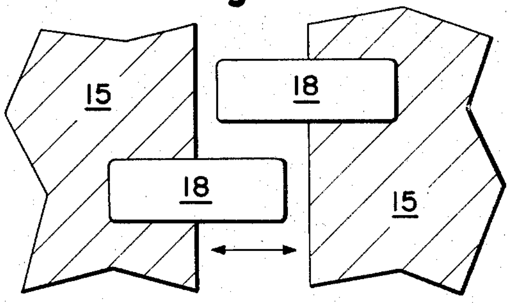
FIG. 11 is a plan view of a portion of the surface of the slice after separations.

FIG. 11 shows a plan view of a portion of two adjacent chips after the inactive regions have been etched away, clearing the separation channel. The beams are free, and the chips are separate.

A typical metallized grid width of 5 to 6 mils has been found useful, above an inactive region of about 8 mils. The width of the etched channel after back etching of the silicon slice typically is about 12 mils at the back of the slice, and 8 mils at the bottom of the channel. Of course, other well known techniques for separating may be used, such as abrasive etching, sawing, etc., or combinations of techniques, including etch breakthrough.

An example of the electroless and electroplating portions of the process will now be described in detail, beginning after the scratch protection oxide 15 is etched from the beam areas.

The slices were immersed in a 1 part 70 percent nitric acid, 1 part water solution at room temperature for 60 seconds. The slices were then removed and rinsed under water for 2 minutes.

The slices were then immersed in a zincate solution for 15 seconds at room temperature, the solution being composed of the following in proportion: sodium hydroxide, 50 grams per liter; zinc oxide, 5 grams per liter; sodium potassium tartrate (rochelle salt), 50 grams per liter; ferric chloride, 2 grams per liter; and sodium nitrate, 1 gram per liter.

After this immersion, the slices were rinsed under water for two minutes.

The slices were then rinsed in a nitric acid solution as described above for a further 15 seconds, and water rinsed for a further 2 minutes.

The slices were then immersed in the above-described zincate solution for a further 25 seconds, and then rinsed in water for 2 minutes.

The slices were then immersed in an electroless nickel solution for 5 minutes, comprised of SEL-REX Lectroless (trademark) nickel, available from SEL-REX division of Oxy Metal Finishing of Canada Limited, 165 Rexdale Boulevard, Rexdale, Ontario, then rinsed in water for a further 10 minutes.

Contact was then made to one exposed metallic spot on each of the slices (by use of a plating slice holder), and gold was electroplated to about 10 to 15 microns. The electroplating solution used was SEL-REX Pur-A-Gold (trademark) available from the aforementioned Oxy Metal Finishing of Canada Limited.

The slices were then rinsed under water for 15 to 20 minutes, and the beam formation was complete.

It is important to realize that the conducting grid which interconnects each of the beam areas is obtained under the top scratch protection oxide, from a normally existing metallization process step. Accordingly, the scratch protection oxide is used as a plating mask, eliminating additional photolithographic etching, which is an important process simplification.

Accordingly, an extremely simple and reliable process has been described for the production of beam leads, which requires no photolithographic steps apart from the separation etch, (should it be used), after the scratch protection oxide has been applied, and the beam areas defined. The gold beams are separated from the aluminum by a stable barrier and adhesive metal. Electrolytic solutions to which the devices are exposed plate metal on the underlying original aluminum metallized layer through any pin holes, thereby filling and sealing them. Excellent uniformity of beam plating is achieved.

It is also extremely important that for the production of beam leads on MOS circuits, no damaging high temperatures or radiation (as is sometimes found in sputtering or electron beam evaporating apparatus) is used. Up to the point of electroless deposition of the zinc, there are no changes required in normal processing of the wafers, and only two masks are required to be slightly modified. In addition, no further metallization masks are required.

The inventive process has been used to fabricate beam leaded MOS Silicon Gate 256 bit random access memories (RAMS). No decrease in yield was observed attributed to this invention. The successful completion of these RAMS using the simple means of fabrication described is believed to be a major advance in the state of the art, considering the high density of high resolution aluminum conductive stripes required.

The inventive process may be used to provide bump external terminals, rather than beam external terminals. In this structure massive bumps are built up on the surface of the semiconductor chips, rather than beams cantilevered outwardly of the surface. The chips are usually used turned upside down and connect to matching terminals on another substrate in mirror image. However, they may also be used as wire bonding pads.

The process for producing the bump terminals is the same as the beam leads, the difference being primarily the aluminum metallization layout and scratch protection oxide mask.

Figure 12:
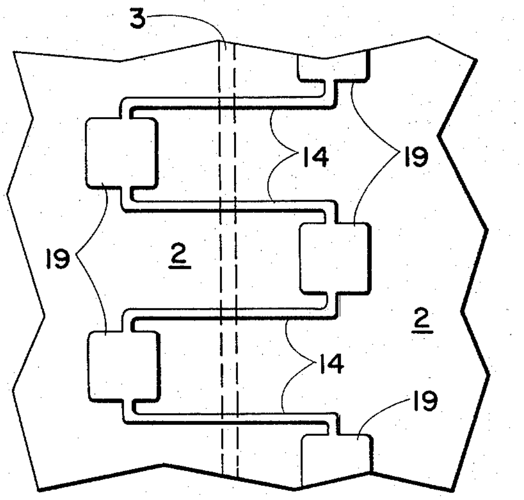
FIG. 12 is a plan view of a portion of the surface of the slice showing another embodiment of the invention.

FIG. 12 is a plan view of a portion of a slice holding a pair of adjacent active chip regions 2, 2. Bump regions 19 are built up in identical fashion as that previously described with respect to the beams 18. However, in this embodiment the underlying aluminum grid pattern 14 follows a zig-zag pattern as shown, crossing the inactive region 3 between active regions 2. The term zig-zag is used here to include such variations as a castellated course. With this pattern, the chips can be separated along the inactive region, whereby each conductor of the grid pattern 14 is severed, open circuiting each bump region from the next.

To avoid deposition of zinc, nickel, and gold on the grid pattern 14, the scratch protection top layer of silicon dioxide overlies the entire surface of the inactive region, and also the normal active regions with the exception of the bump regions 19. The bump regions preferably do not overlie the inactive region 3.

When solder connection is to be used for mounting, the heavy gold plating may advantageously be replaced with a cheaper metal such as copper or silver.

The important feature of the zig-zag course is that the grid pattern conduction paths cross the chip separation boundary or inactive region between every pair of connections to adjacent bumps or terminal pads on the same chip.

This structure is particularly useful where it is desired to make the inactive region as narrow as possible, in order to crowd as many chips as possible onto a slice. The embodiment lends itself to use of a scribe and break or sawing technique of separation in substitution of the previously described back etching technique.

In general, therefore, it may be seen that for both beam lead and bump configurations, the short circuiting grid is disposed over the inactive region in a position which will allow elimination of the short circuit when the chips are separated by either cleaving through or etching away the inactive region.

It is to be understood that the above described arrangements are illustrative of the application of the principles of the invention. Numerous other arrangements may be devised by those skilled in the art without departing from the spirit and scope of the invention.

What is claimed is:

1. A semiconductor structure comprising:

a. a body of semiconductor material, b. a pair of spaced contact regions on a surface of said body, c. an inactive region of semiconductor material extending transversely through said body, intermediate said contact regions, d. an insulative layer adherent to and covering the surface except over said contact regions, e. conductive stripes of aluminum adherent to and overlying the insulative layer, in contact with said surface at each of said contact regions, individually extending over the inactive region short of the edge of the inactive region adjacent the opposite contact region.

f. an additional stripe of aluminum continuous with the conductive stripes adherent to and overlying the insulative layer above the inactive region, narrower in width than the inactive region, g. an insulative layer covering and adherent to the surface of said body, including the surface of the aluminum, except over defined beam lead surface areas of said conductive stripes of aluminum, said areas extending from ends at the edges of the inactive region to positions on the body of the semiconductor material away from the inactive region, h. a layer of zinc adherent to and overlying the surface of the uncovered surface of the aluminum, i. a layer of nickel adherent to and over-lying the surface of the zinc, j. individual massive gold beams adherent to and overlying the surface of the nickel.

2. A semiconductor structure as defined in claim 1 further comprising an array of active chip areas surrounded by inactive regions, a plurality of contact regions on each chip area, the conductive stripes of aluminum individually extending about to the edge of the inactive region adjacent the opposite chip area, said additional stripe of aluminum continuous with all the conductive stripes in a grid pattern.

3. A semiconductor structure as defined in claim 2 in which the insulative layer is comprised of silicon dioxide, and the semiconductor material is comprised of silicon.

4. A semiconductor device comprising:

a. a body of silicon semiconductor material having a surface to which external contact is to be made, b. a silicon dioxide insulative layer adherent to and covering the surface except over a predetermined contact region, c. a conductive stripe of aluminum adherent to and overlying the insulative layer and in contact with said surface in the contact region, extending to the edge of the device, d. a layer of electrolessly plated zinc adherent to and overlying a portion of the surface of the aluminum adjacent the edge thereof, e. a layer of metal chosen from the group consisting of silver and nickel adherent to and overlying the surface of the zinc, f. electrically conductive beams of uniform thickness adherent to the surface of the said layer of metal adjacent said edge, and cantilevered outwardly from the edge of the device, and g. an insulative layer covering and adherent to the remaining surface of the semiconductor body and the unplated conductive stripe of aluminum.

5. A semiconductor device as defined in claim 4 in which said layer of metal is comprised of nickel, and the electrically conductive beams are comprised of gold.

6. A semiconductor device as defined in claim 5, in which the aluminum has a thickness of approximately between 0.5 and 2 microns, the nickel has a thickness approximately between 0.5 and 2 microns, and the beams have a thickness approximately between 10 and 20 microns.

7. A semiconductor structure comprising:

a. a body of semiconductor material comprising a group of monolithic circuits, each having a layer of conductive material defining predetermined circuit paths, and having a protective non-conducting coating over all portions except over defined external terminal surface areas of the conductive material, b. an inactive region separating each of the monolithic circuits, c. a conductive grid comprised of said conductive material, coated by the non-conducting material, interconnecting each of said circuit paths, passing over the inactive region with each traverse between each of said circuit paths, d. a layer of plated intermetal adherent to and overlying only the external terminal surface areas of the conductive material, and e. a massive layer of external terminal metal overlying and adherent to said intermetal.

8. A semiconductor structure as defined in claim 7, including an extension of each of said circuit paths extending perpendicularly to the edge of its associated monolithic circuit partially across the inactive region, said grid being confined within the boundaries of the inactive region.

9. A semiconductor structure as defined in claim 7, in which said grid is disposed along a zig-zag path having an axis parallel to the axis of, and central of the inactive region, connected to each of said circuit paths.

10. A semiconductive structure as defined in claim 9 in which the exposed portions of the conductive material are located wholly over the monolithic circuits.

11. A semiconductor structure as defined in claim 7, in which said exposed portions of the conductive material are located at positions over the monolithic circuits adjacent the boundaries thereof, the conductive grid following generally castellated paths between and interconnecting each of said exposed portions, each grid path between each of said exposed portions passing over the inactive region; the semiconductor material being comprised of silicon, the non-conducting coating being comprised of silicon dioxide, the intermetal being comprised of a layer of zinc covered by a layer of nickel, and the external terminal metal being comprised of gold.

12. A semiconductor structure as defined in claim 10 in which said zig-zag path is generally castellated in form.

13. A semiconductor structure as defined in claim 7, in which the conductive material is comprised of aluminum and the intermetal is comprised of a layer of zinc covered by a layer of nickel, and the external terminal metal is comprised of gold.

* * * * *